United States Patent
Blades

(10) Patent No.: US 6,876,203 B2
(45) Date of Patent: Apr. 5, 2005

(54) PARALLEL INSULATION FAULT DETECTION SYSTEM

(76) Inventor: Frederick K. Blades, 2450 Four Mile Canyon, Boulder, CO (US) 80302

( * ) Notice: Subject to any disclaimer, the term of this patent is extended or adjusted under 35 U.S.C. 154(b) by 115 days.

(21) Appl. No.: 10/167,671

(22) Filed: Jun. 10, 2002

(65) Prior Publication Data

US 2002/0196031 A1 Dec. 26, 2002

Related U.S. Application Data

(63) Continuation-in-part of application No. 10/055,753, filed on Jan. 23, 2002.
(60) Provisional application No. 60/296,734, filed on Jun. 11, 2001.

(51) Int. Cl.[7] .................................................. H01H 9/50
(52) U.S. Cl. ......................... 324/536; 324/540; 324/541
(58) Field of Search ................................. 324/539, 540, 324/541, 544, 551, 459

(56) References Cited

U.S. PATENT DOCUMENTS

| | | | | |
|---|---|---|---|---|
| 6,496,015 B2 | * | 12/2002 | Stanford et al. | 324/541 |
| 6,570,389 B2 | * | 5/2003 | Singh et al. | 324/459 |
| 2001/0052778 A1 | | 12/2001 | Smith | 324/541 |
| 2001/0054902 A1 | | 12/2001 | Smith et al. | 324/544 |

* cited by examiner

Primary Examiner—N. Le
Assistant Examiner—Timothy J. Dole

(57) ABSTRACT

A device for detecting and locating arcs in a set of wires is discussed. The device comprises a probe for discharging controlled current to an exposed portion of a wire in the set of wires. The probe includes a handleable enclosure and an elongated structure which projects from the enclosure for conducting a gas and for enclosing a needle that has a tip. A suitable gas includes gases that have low electron attachment, such as helium. The device further comprises a control unit for communicating control signals as well as the gas to the probe. The control unit includes a controller, a valve being controllable by the controller and being capable of regulating the flow of the gas, and a high-voltage generator being controllable by the controller to generate a high-voltage signal, which can be communicated to the probe by the control unit.

19 Claims, 10 Drawing Sheets

PARALLEL INSULATION FAULT DETECTION SYSTEM

CROSS-REFERENCES TO RELATED APPLICATIONS

This application claims the benefit of U.S. Provisional Application No. 60/296,734, filed Jun. 11, 2001, which is expressly incorporated herein by reference. This application is also a continuation-in-part of U.S. application Ser. No. 10/055,753, filed Jan. 23, 2002.

FIELD OF THE INVENTION

The present invention relates to the detection of insulation faults in electrical wiring systems that may lead to electrical arcing. More specifically, it relates to a system of diagnostic tools by which insulation faults in wiring systems can be revealed and located before they develop into arcing faults. Although principally directed towards the diagnosis of wiring faults in aircraft wiring systems, these methods and tools apply directly to other fields including residential, industrial and commercial power systems. In this patent the word "fault" is used to refer to both a degradation of the insulation, e.g., an "insulation fault" and a specific failure, e.g., an "arcing fault."

BACKGROUND OF THE INVENTION

A parallel arcing fault occurs when an undesired electrical arc bridges the gap between two conductors or a conductor and ground. Since the dielectric strength of air is known to be approximately 31 kV/cm, it is generally understood that exposed conductors in air and at line voltages (e.g., 117 V rms) must come to within a few mils (1 mil=0.001 in) of each other before an arc can strike (Note that 167 Volts peak divided by 31 kV/cm is 2.1 mils). Power distribution systems are therefore commonly designed to avoid this by maintaining conductor separation much greater than a few mils and/or providing adequate insulation between the conductors. It is also understood that parallel faults may develop if the separation between said conductors is inadvertently diminished or if the integrity of the insulation is violated as the result of, for example, chafing caused by mechanical vibration. In addition to these obvious scenarios there are subtler, less obvious ways in which parallel faults might develop, particularly in the aircraft environment.

First there must be exposed conductors. These can be found at the terminals of circuit breakers, on terminal strips and at some connector terminals. Conductors inside wires may become exposed as a result of aging cracks or holes in the insulation. In October of 2000, an FAA aviation industry task force reported that during the inspection of a relatively small amount of KAPTON wiring on both a >20 year old Airbus A300 and a Lockheed L-1011, 9 cracks that exposed the conductor were found on the former and 13 cracks on the latter. See Transport Aircraft Intrusive Inspection Report prepared by The Intrusive Inspection Working Group, Christopher Smith, Chairman, Dec. 29, 2000. From this limited data they extrapolated that there might be up to 900 cracks on the A300 and 3,000 on the L-1011. It should be recognized that even a large number of aging cracks in the wire insulation poses little danger of arcing unless the separation between two cracks or a crack and the airframe becomes small enough for an arc to occur at normal operating voltages. How small? Based on a simple linear extrapolation of the dielectric breakdown voltage of air the separation would have to be on the order of several mils or less for arcing to occur. Unfortunately, parallel faults can develop across separations substantially greater than this due to secondary environmental influences.

Once there are exposed conductors within a fraction of an inch of each other or the airframe, initial conduction across the gap can develop in several ways. First, if a voltage surge high enough to span the gap occurs, resulting from an inductive switching transient or perhaps induced by a lightning strike, the localized heating from the momentary arc can carbonize insulating material under the arc, including dust or other contamination on the surface of the wire, and form a high-impedance conduction path. A second and perhaps more likely scenario involves water that normally condenses on the inner shell of the aircraft as the outside temperature drops precipitously during flight. This condensation water readily dissolves impurities that are present and becomes a mildly conductive electrolyte that can conduct a small AC current across the gap. This current produces heat and the heat evaporates the water leaving behind molecular islands of salt that eventually form a kind of archipelago of larger conductive islands. Each time it gets wet, the electrolyte itself will support current flow and add more salts to the developing archipelago. The arc breakdown potential is proportional to the sum of the distances between conductive islands.

What happens next depends on the wire insulation material. Both a Polyimide plastic sold under the brand name KAPTON and Fluorocarbon plastics sold under the brand name TEFLON have been widely used in aircraft wiring. If the insulation is TEFLON, this low-current arc will repeatedly extinguish with little damage done. If the insulation is standard KAPTON (i.e., non fire-resistant), the low-current salt bridge arc will soon involve the KAPTON itself, expand and escalate rapidly into a near explosion of current that often destroys not only the wires involved but also adjacent ones in the wire bundle.

A number of articles in the press have noted the apparent arcing danger of KAPTON insulation. In the presence of a low-current arc KAPTON insulation can easily develop into an explosive arc while TEFLON exhibits only gradual, slow deterioration of the TEFLON heated by the arc. Research by the present inventor has shown that KAPTON can become conductive in the near vicinity of an arc. Localized heating of the KAPTON apparently oxidizes portions of it to a conductive intermediary (remaining amber in color, it does not appear to be completely oxidized to carbon at this stage) that reduces the arc gap and increases the electric field strength. Under a stereo microscope, one can see minute pieces of KAPTON conducting current and arcs jumping from the glowing KAPTON to the metal conductor. Insulating materials like TEFLON contain halogens that inhibit oxidation by producing by-products that are more electronegative than Oxygen, e.g., Fluorine. Standard KAPTON doesn't have this fire inhibitor and this may in part explain the difference.

The formation of aging or stress-induced cracks in the insulation and the repetitive condensation, wetting, and low-current arc induced evaporation cycle together form a progressive degeneration process that can lead to parallel arcing. Mechanical chafing of the wire insulation can also lead to parallel arcing. As the world's fleet of commercial and private aircraft age, particularly now that many aircraft over 20 years old are still flying, the likelihood of such faults occurring increases. If these developing faults can be detected early enough, the insulation could be repaired or replaced before the fault develops into a dangerous arcing fault. A need exists, therefore, for a means by which wiring harnesses could be tested to reveal these conditions as they are developing.

The present inventor realized that developing parallel faults, due to mechanical chafing or aging cracks in the insulation, for example, will generally exhibit a progressively declining breakdown voltage until a point is reached where the arcing becomes self-sustaining and dangerous. Such developing faults in the insulation are initially non-conductive and usually so small as to make no perceptible change in the characteristic impedance of the cables. The only practical way to reveal reduced conductor spacing (or a non-conducting salt bridge) is to apply a higher-than-normal voltage to the junction, a testing procedure commonly referred to as HiPot (High Potential) testing. A traditional DC HiPot tester, however, which allows 10 ma of current to flow after breakdown, can itself heat the insulator enough to form a carbon track and damage the insulation. A conventional HiPot tester can also damage equipment left connected to the harness during testing. A further need exists, therefore, for a means by which the breakdown voltage can be measured without damaging the wire insulation or any electronic devices inadvertently connected to the harness.

Wire harnesses in modern aircraft are dense, multi-legged, and routed throughout the plane—up to 140 miles of wire in a typical wide-body jet. Hundreds of connectors are placed along the harnesses to allow modular assembly and disassembly of components. Because access to wiring harnesses is very limited on an operational aircraft, such testing is probably best done during periodic heavy-checks, whereupon panels and floorboards are removed to facilitate access. Even in this case, however, specific wire bundles may be very long and difficult to access. There exists a further need, therefore, to provide practical means to physically locate the developing parallel fault once it has been revealed.

SUMMARY OF THE INVENTION

One principal idea of the parent application is based on the understanding that as a parallel fault develops over time, due to chafing, etc.; the dielectric withstanding voltage of the fault will fall in approximate unison. If a voltage higher than the normal operating voltage is applied to such an imminent fault, it can be made to flash over before it would in normal operation thus revealing the fault before it becomes an actual arcing fault.

The dielectric voltage test is performed according to the parent application by charging the interwire capacitance between a first Wire Under Test, or WUT, and the remaining grounded wires of the floating cable harness, using a microampere, high-compliance current source. In this manner, the voltage on the WUT rises from zero in a ramp-like fashion to a specified maximum test voltage. If a fault exists between the WUT and any other wire or ground (the airframe) that has a breakdown voltage less than the maximum test voltage, a single low-energy discharge will occur at the fault, discharging the cable capacitance into the arc. Since the interwire cable capacitance will be on the order of hundreds of picofarads only, the total energy in the discharge will be low, on the order of microjoules. This is on the order of the energy contained in a static spark discharge when walking across a carpet and then touching a grounded surface and is low enough to avoid damaging the wire insulation at the fault. Also, by charging the cable with a microamp-range current source no danger is presented to any devices that may inadvertently be left connected to the harness during the test. If, for example, connectors at the far end of the harness are inadvertently left plugged into their loads, a 1 microamp current source will only be able to charge the line to a few millivolts. In this case, the test system will sense this condition and indicate to the user to disconnect the loads before proceeding.

With a 1 microamp current source, a cable interwire capacitance of 1000 pf, and a maximum test voltage of 1500 volts, for example, the complete ramp sequence for the first WUT will take less than 2 seconds. Assuming no breakdown, an automatic sequencer then switches to the next wire in the harness, makes this the second WUT, grounds the others, and repeats the sequence. In this manner, the entire harness can be quickly and automatically tested for parallel faults between conductors or between any conductor and ground.

If a fault exists with a breakdown voltage below the maximum test voltage, a single micro-energy discharge will occur across the fault. A second principal idea of the present invention is based on the realization that the leading edge of this discharge will be extremely clean and fast, dropping from the high breakdown voltage to zero in a fraction of a nanosecond. Because electromagnetic radiation travels at about 1 ft/ns any method for locating the arc based on the measurement of time delays would have to resolve time differences on the order of a nanosecond or better. To obtain repeatable and therefore useful results the edge of the received signal must be very sharp, clean and repeatable to a nanosecond or better. The inherent speed and amplitude of the edge produced by the single spark discharge described above meets this criteria and therefore makes possible several different locating methods, to be discussed later.

The sharpness of the received leading edge depends on how quickly the stored charge can be delivered to the arc. If, for example, a discrete capacitor is connected to the arc gap with a wire, the charge stored in the capacitor must travel through this wire to be delivered to the arc. The inductance of this wire together with whatever capacitance exists at the arc forms a low-pass filter that slows down the leading edge. A controlled-impedance cable such as a coaxial cable, on the other hand, acts like a transmission line—the distributed inductance and capacitance work in unison, transferring the charge back and forth much in the same manner as the mechanism that allows the propagation of electromagnetic waves through space. Thus the fast leading edge is preserved in a controlled impedance cable. Indeed it is well known by those skilled in the art that the most convenient means of producing a fast leading edge in the laboratory is to discharge a coaxial cable charged to a high voltage.

A cable harness typical to aircraft wiring is not designed to be a controlled impedance transmission line. Research by the present inventor, however, has shown that because the wires are tightly and neatly bundled according to aircraft harnessing standards, and because all the wires in the bundle are grounded except the single WUT, the impedance becomes relatively constant and the combination acts like a transmission line. Depending on the number of wires and the thickness of the insulation, the resulting impedance is typically 50–80 ohms. Even when individual wires feed off the harness the effect on the impedance at that point is minimal because that wire is only one of many that serve as the ground return.

As disclosed in the parent application, this fast edge from the micro-energy arc induced at the fault is used in two different ways to determine the location of the arc. In a first method based on conducted radiation, the difference in arrival times between the reception of the leading edge at one end of the cable harness and a second reflected edge is used to calculate the approximate distance down the cable that the arc originates. In a second spatial method based on radiated radiation, two or more miniature high-speed receivers are employed and the difference in arrival times is used to calculate where in the space between the receivers the arc originates. A third and final arc locating method uses a handheld ultrasonic monitor to measure and indicate the distance from the operator to the arc. It measures both the electromagnetic pulse from the arc and the ultrasonic emission from the arc and uses the difference in arrival times to calculate the distance to the arc.

The spatial arc locating method mentioned above can be also used to rapidly detect and locate in space any type of electrical arcing. But because this approach monitors for any fast electromagnetic edge, it is susceptible to extraneous noise with fast rise times and therefore perhaps not suitable for applications that require a high immunity to false tripping. In specific applications, however, it offers the unprecedented ability to detect and locate an arc within a microsecond or so, much faster than other arc detection methods. Furthermore, since the method locates the arc it can reject noise that is seen to have originated outside the environment under test. One application possibility is the use of this spatial arc locating method inside an aircraft during a heavy check procedure as a non-intrusive method to detect and locate electrical arcs as individual systems are turned on and off.

The preferred embodiment disclosed in the parent application, is a Parallel Fault Diagnostic System that comprises several components. The first component, referred to as the Micro-Energy Dielectric Tool or MED tool, is a handheld, battery-operated unit that plugs into a cable harness using an adapter cable, and applies a low-current, high-compliance current source sequentially to each conductor in the harness while grounding all other conductors. The interwire capacitance between each conductor and the others is thus charged in a ramp-like fashion to a specified maximum test voltage. An internal microprocessor system takes various measurements during this ramp process and from these calculates the insulation resistance and capacitance for display to the user. If a breakdown occurs between the charged wire and any other wire or ground, the microprocessor will record the voltage level at which the breakdown occurred and switch automatically to a fault-locating mode. High-speed circuits internal to the MED tool will now process the received high-frequency edges and attempt to determine how far down the cable the fault is. If the fault is from wire to wire, the signal will usually give a clear reading of this distance. If the fault is from a wire to ground (the airframe) the signal will likely not be clear enough to discern the distance using this method.

A second component, also disclosed in the parent application and referred to there as the Electromagnetic Locating Tool or EML tool, is another battery-powered handheld unit that provides a second independent method for locating the arc. The EML tool consists of a small, handheld controller and two or more small receiver units, each connected to the controller with a coaxial cable. The receivers are placed at the extremes of the area to be monitored and the controller is held in the technician's hand. This EML tool works by receiving the radiated electromagnetic edge produced by an arc simultaneously with multiple receivers, and then calculating the location of the arc relative to the controller based on the difference in signal arrival times.

A third component disclosed in the parent application, the Ultrasonic Locating Tool or USL tool, is another handheld unit that provides yet a third method of locating the fault. The USL tool senses both the electromagnetic edge and the ultrasonic radiation from the discharge and by timing the difference in arrival times, determines the distance from the user to the arc.

Each of the three location methods disclosed in the parent application has particular advantages and disadvantages in various applications. The MED tool works in unison with the EML and USL options.

The present continuation of the parent application discloses improvements to and new features of the Parallel Fault Diagnostic System.

The first improvement is to the MED tool itself. As discussed in detail in the parent application, the width of the first pulse received by the high-frequency circuits of the MED tool after a breakdown occurs is proportional to the distance to the fault. The MED tool measures this pulse width to determine the distance to the fault. As further noted in the last paragraph of the section entitled "High-speed circuit", the amplitude of this first pulse will be attenuated if the other, non-involved wires in the harness are grounded instead of floating. The more attenuated this pulse is the more difficult it becomes to accurately measure its width. A sequencing method is described in the parent application that overcomes this problem but the method requires a more complex sequencer than the preferred embodiment described.

The reason the grounded extra wires attenuate the leading pulse height is because signals coupled to these wires from the WUT experience an inversion at the grounded point. Accordingly the first improvement of the present invention consists of including termination resistors in each lead of the sequencer to minimize reflections on these extra wires. This simple change substantially reduces the attenuation to the pulse caused by inverted reflections on non-involved wires thereby permitting the effective use of the simple sequencer described in the parent application.

A second idea disclosed herein is yet another diagnostic tool that can be used in conjunction with the MED tool or independently, to physically detect and locate insulation faults. The Dry Insulation Fault tool (DIF tool) consists of a small, handheld diagnostic probe that a technician physically guides along near the surface of a cable harness to search for insulation breaks within. The probe is responsive to exposed conductors and will produce a signal responsive to the distance from the tip of the probe to the break, which can be used to guide the operator directly to the break.

The invention is based on several new insights and realizations: First, by using a fine-tipped high-voltage probe and limiting the available current, gases (including air) can be made to conduct a minute but consistent amount of electricity over large distances (3–12") through a mechanism that can be called partial avalanche breakdown. Second, the current in such a partial discharge is generally proportional to distance and can be used to indicate the distance to the fault. Third, the distance over which the probe is effective can be increased and made more consistent by flowing pure He gas around the probe. And fourth, while high-voltage is needed to transverse the gas barrier, the current resulting from this voltage can be limited to such a low level that it is safe for both personnel and electronic devices connected to the line.

The distance on either side of the insulation break at which the probe will begin indicating the presence of a break is on the order of 1–4 inches in air and up to 8 inches or more with an optional Helium source attached to the probe. Current flows from the high-voltage probe tip to the circuit common of the DIF tool, which is made available at a terminal on the bottom of the plastic-insulated DIF tool case.

The manner in which the DIF tool senses faults depends on where this DIF common terminal is connected.

In one useful application the DIF common is connected to the airframe (ground). In this case the tool is responsive to insulation breaks in any connected wire in the aircraft, whether powered or unpowered. The particular advantage of this mode of operation is that it can be used on cable harnesses in-situ without unplugging, turning off, or otherwise disturbing the harness. A disadvantage is that the tool also senses the airframe itself responding much like a metal detector as the probe approaches metal surfaces. The abrupt cutoff of conduction past a certain distance due to the avalanche conduction mechanism, the distance being dependent on the applied voltage, mitigates this problem. Tests on wire bundles several inches above a metal ground plane to simulate typical aircraft cable harnesses have demonstrated that insulation faults along typical cable runs can be effectively found. This mode of operation is clearly less effective where the harness goes through holes in metal struts, for example.

If the DIF common is instead connected to a single floating wire in a harness the tool will be responsive to insulation breaks on that wire alone. It will not respond to the airframe or any other wires. This mode of operation is facilitated by a second improvement to the MED tool of the parent application. A simple modification to the MED sequencer, consisting of the addition of two relays, supports a diagnostic mode whereby the sequencer connects the DIF common to the selected WUT. In use, the MED tool automatically tests each wire in the harness as described in the parent application. If a fault is detected, the MED tool sequencer is then switched to connect the DIF common to the currently selected WUT. Now the DIF tool becomes responsive to insulation breaks in the WUT alone and can be used to find the fault, starting at the approximate distance to the fault provided by the MED tool.

The preferred embodiment of the DIF tool of the present invention includes an optional circuit that allows the DIF tool to sense when the probe is within a small fraction of an inch of the conductor, in order to indicate to the user that the fault has been located. A second optional circuit is disclosed that allows the DIF tool to detect whether the sensed conductor is powered by the AC line voltage.

The MED tool of the parent application is based on applying an elevated voltage across the fault to reveal it. The maximum distance across the fault, e.g., between cracks in the insulation on adjacent wires or between an insulation crack and the airframe, that can be detected is proportional to the maximum test voltage applied by the MED tool—the higher the voltage the larger the detectable fault distance. Because the conductor-to-conductor spacing is generally the smallest at connector pins, this maximum voltage is often limited to the dielectric breakdown voltage of the connectors used. Thus, for example, a typical aerospace connector with a breakdown voltage of 3000 volts limits the harness test voltage to the same. Another idea of the present invention is a method and means by which an Effective Test Voltage that is higher than the actual applied test voltage can be achieved over portions of the harness.

Pure helium gas has unique physical characteristics that cause it to exhibit a breakdown voltage that is on the order of 1/3 to 1/5 that of atmospheric air. By directing a flow of pure helium gas over portions of a harness connected to the MED tool, an Effective Test Voltage of 3× to 5× the applied voltage can be achieved in that portion of the harness covered by the gas flow. For example, a harness with 3000 volt connectors can be tested to an Effective Test Voltage of 9 kV to 15 kV in selected areas. Accordingly, another method of the current invention is to use the DIF tool, or another means to direct a flow of pure He gas over selected portions of the harness, to raise the effective MED tool test voltage.

Yet another novel method of the present invention recognizes the value of testing electrical systems in situ, i.e., fully connected, under normal operating conditions and with power applied. Instead of applying higher-than-normal voltages to reveal imminent parallel faults, the gaseous environment surrounding the electrical system is altered in such a manner as to lower the arcing potential and thereby reveal developing faults. The arcing potential may be lowered in one of two ways. First, as discussed above, the air can be replaced with pure He to lower the arcing potential. Second, since the arcing potential also goes down with decreasing pressure, the pressure can be lowered. Either method or both methods together may be used to lower the arcing potential. Indeed, if the minimum arcing potential could be lowered to significantly below normal operating voltages, this might prove an effective method to reveal developing parallel faults in situ, in a non-intrusive manner and all at once. Unfortunately, an analysis of the physics shows that although the arcing potential can be reduced by both gas type and pressure, there is a theoretical minimum arcing potential below which it will not drop, calculated to be just/over 300 volts in air and about 150 volts in Helium. The physics will be discussed in more detail in the body of this patent. The utility of this method, therefore, is highest in electrical systems with normal operating voltages higher than the standard 120 volt line level.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT MED TOOL IMPROVEMENTS

Figure 1:
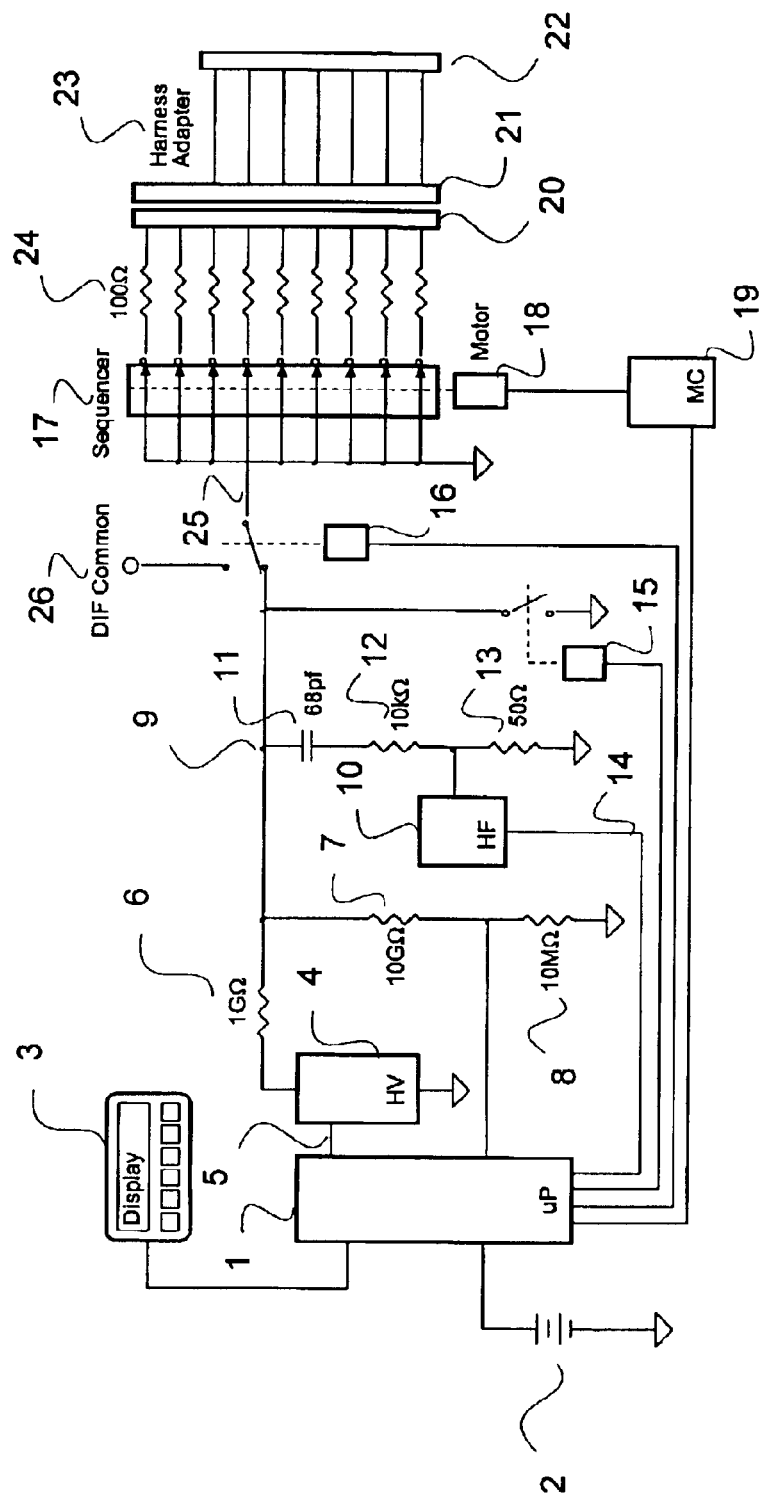
FIG. 1 is a simplified schematic of the Micro-Energy Dielectric (MED) Tool.

A schematic block diagram of the MED tool is shown in FIG. 1. The microprocessor subsystem 1 represents a control system that includes a microprocessor, interfaces and analog circuits. All of these are conventional implementations available to anyone skilled in the art. The entire system is powered by a rechargeable internal battery 2. The separate keyboard/display unit 3 conveniently connects to the unit with a serial RS232 link. An integral keyboard/display unit could also be used. A low-current high-voltage switching supply 4 produces a DC output voltage that is proportional to a control voltage 5 produced the microprocessor. In this manner, the microprocessor can set the high-voltage as required by the measurement. The maximum voltage should be on the order of 3000V to 6000V depending on the application. A variety of suitable high-voltage supplies are available from EMCO High Voltage Corporation, Sutter Creek, Calif. A high-valued resistor 6 limits the maximum current and makes the high-voltage supply 4 act as a current source for low resistance loads. For example, a 5000 volt supply with a 1 Gigohm resistor will limit the maximum current to 5 microamps. When this is applied to a wiring harness it will only charge a selected wire to high voltage if there is no load attached. If a real load having a DC resistance of less than say 100 kilohms remains inadvertently attached, the load will see a substantially constant current of only 5 microamps and this will produce a maximum voltage rise of only a few hundred millivolts. Two resistors, 7 and 8, form a voltage divider to allow the microprocessor to monitor the voltage at point 9.

A high-speed timing circuit 10 is provided to measure the pulse width of the incident and reflected waveforms in order to determine the distance down the harness the arc originates. A high-frequency coupling network consisting of 11, 12 and 13 couple the signal to the circuit 10 and the output of the circuit 14 is a DC level proportional to the distance.

A first relay 15, controlled by the microprocessor 1, serves to short the output 9 to ground. The sequencer 17 is a specialized stepping relay that serves to connect the output 9 to a single pin on the connector 20 while grounding all the other pins. The relay is advanced by a stepping motor 18 under control of the microprocessor 1 by way of a stepping motor controller 19. One mechanical embodiment of this sequencer is shown in the parent application. The harness adapter 23 serves to provide a connector 22 that mates to the harness to be tested. The number of pins on the harness can be up to the number of pins on the MED tool connector 21. In operation, the number of pins is inputted to the microprocessor and it controls the sequencer to switch between these pins only.

The description to this point is consistent with the preferred embodiment of the parent application. In accordance with the first improvement of the present invention, a termination resistor 24 is added in series with each sequencer contact. These resistors serve to terminate each of the grounded harness wires into the cables' characteristic impedance in order to absorb arriving energy and thereby minimize reflections. The value of these resistors should be approximately equal to the characteristic impedance of the cable, typically on the order of 100 ohms. Because the high-frequency load impedance presented by the MED tool on the Wire-Under-Test (WUT) 25 is high, on the order of 10 kohm, the series resistor on this line as little effect.

As described in detail in the parent application, the traveling wave from the arc discharge reflects at the MED tool with no polarity inversion because the impedance at that point is high. This traveling wave couples also to adjacent wires in the harness and travels likewise from the arc discharge to the MED tool, this time reflecting with inversion due to the low impedance encountered at the sequencer, i.e., when no resistors are present. The result is a reduction in the amplitude of the initial pulse, which makes it more difficult to accurately measure its width. The addition of termination resistors serves to absorb the arriving energy and minimize reflections on these lines thereby preserving the amplitude of the pulse.

The second improvement of the present invention is accomplished with the addition of a SPDT relay 16. This relay serves to switch the selected WUT 25 from the high-voltage line 9 to an external terminal 26 conveniently labeled "DIF Common". When the DIF Common terminal 26 is selected, the sequencer-selected WUT is thus directly connected to this terminal. By connecting the DIF common to this terminal, the DIF tool will be responsive to insulation breaks on the WUT only. A detailed description of the DIF tool follows.

DIF Tool

The Dry Insulation Fault tool of the present invention is based on several new insights and realizations. The first is that gases can be made to conduct a small amount of electricity over relatively large distances through a mechanism that the inventor terms partial avalanche breakdown. The mechanism is generally described as follows. A relatively high voltage, on the order of 5000 volts is applied to a fine needle point to produce a high electric field gradient at the tip. This gradient is sufficient, i.e., greater that about 30 kV/cm, to ionize the air at the tip and produce electron avalanches that proceed simultaneously in all directions out away from the tip. Most of these free electrons are rapidly quenched by electrophilic or "electron-loving" constituents of the gas, principally oxygen. Statistically, however, a few electrons do reach up to an inch or more. If a return path to the high-voltage power supply is available at that distance, the avalanches along that path will grow rapidly and a spark discharge will occur, discharging all the available electrons at once and producing a spark similar to the familiar static discharge that may occur from walking across a carpet. If, however, the current is limited to a very low current, say a few microamperes, then the rapid complete ionization of the path is inhibited, a spark discharge is prevented, and only a small, nearly invisible current flows. Since complete avalanche breakdown is prevented by limiting the current, the mechanism is referred to as "partial avalanche breakdown." Accordingly, one principle element of the present invention is to use a limited-current, high-voltage DC supply connected to a probe with a small effective tip radius to promote limited electronic conduction through the gas.

These electron streamers that progress from the high voltage gradient at the tip are similar to the streamers that precede an atmospheric lightning strike. Because the overwhelming majority of streamers are quenched by oxygen absorbing the free electrons, the progress of the streamers is very irregular, even chaotic. This can be readily observed as bursts of current that come and go, becoming more erratic as the distance is increased. If the oxygen and other electronegative constituents were removed from the gas, in order to prevent quenching of the free electrons, then the streamers would become much more consistent and reach much farther distances. Accordingly, a second aspect of the present invention is to replace the air with a gas that minimizes the quenching of these free electrons.

Helium gas is well suited to this task because it is a noble gas with a fully satisfied electron pair in the first orbital, i.e., it has little affinity for capturing free electrons. Any impurities that may be present in the Helium, however, may themselves quench the avalanches so it is important to use highly purified Helium. Ultra pure or Research-grade Helium works well and is readily available from industrial gas supply companies such as Airgas of Radnor, Pa. By flowing a steady stream of pure He over the probe needle, in such a manner as to have the gas carry over towards the harness under investigation, several useful advantages are realized. First, the current that flows under the same physical circumstances is much higher than in air, on the order of 30 times, for the reasons discussed. Second, the maximum distance over which a current can be practically measured is also higher, being on the order 8–10 inches in pure Helium. Third, the current is more consistent and less erratic in He than in air. And fourth, since enhanced conduction occurs along the flow of the gas, it gives the DIF tool some directionality which helps reduce undesired conduction paths.

An initial prototype was constructed using a steel sewing needle inserted into a miniature plumbing T in such a manner as to allow Ultra pure He gas to flow past the needle and across an adjustable-distance gap to a section of 18 ga. PVC-insulated wire with a small break cut into the insulation. The test circuit consisted of a 5000 volt DC power supply with a source resistance of 170 M$\Omega$ and a battery-powered current-voltage converter with a response of 1.1 V/$\mu$A. All tests were performed at 73° F., 37% RH and 5000 ft altitude above sea level.

Figure 2:
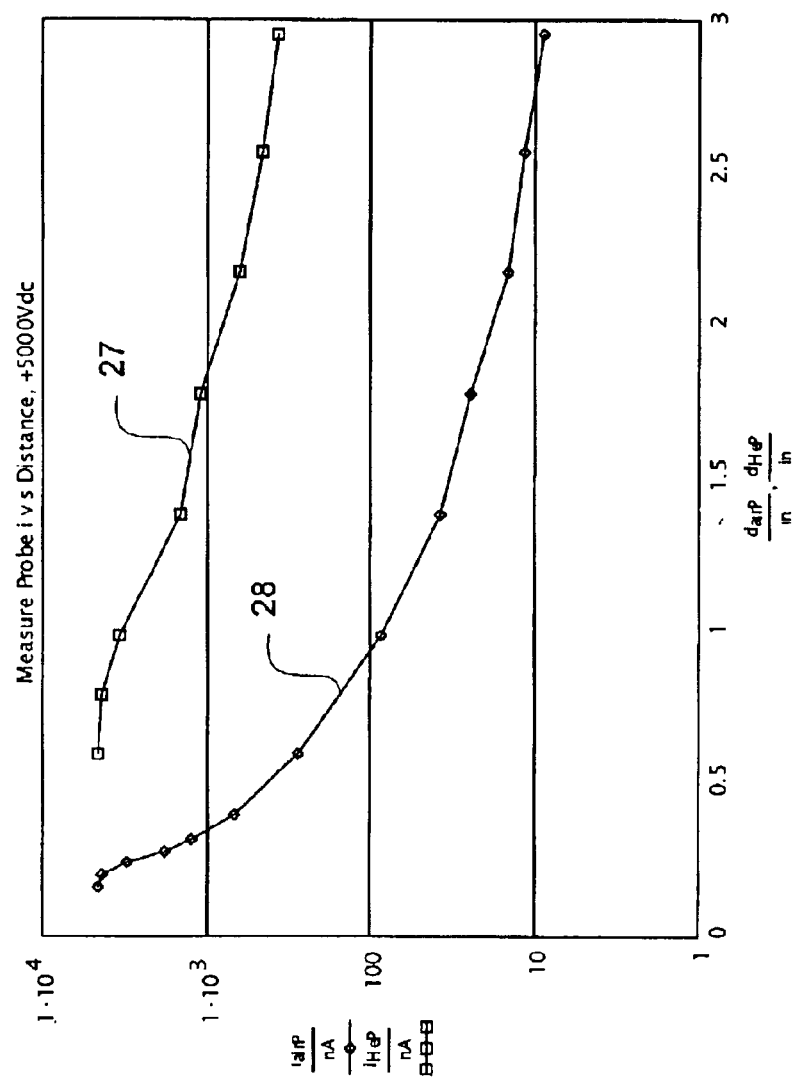
FIG. 2 is a graph of probe current vs. distance at +5000V.
Figure 3:
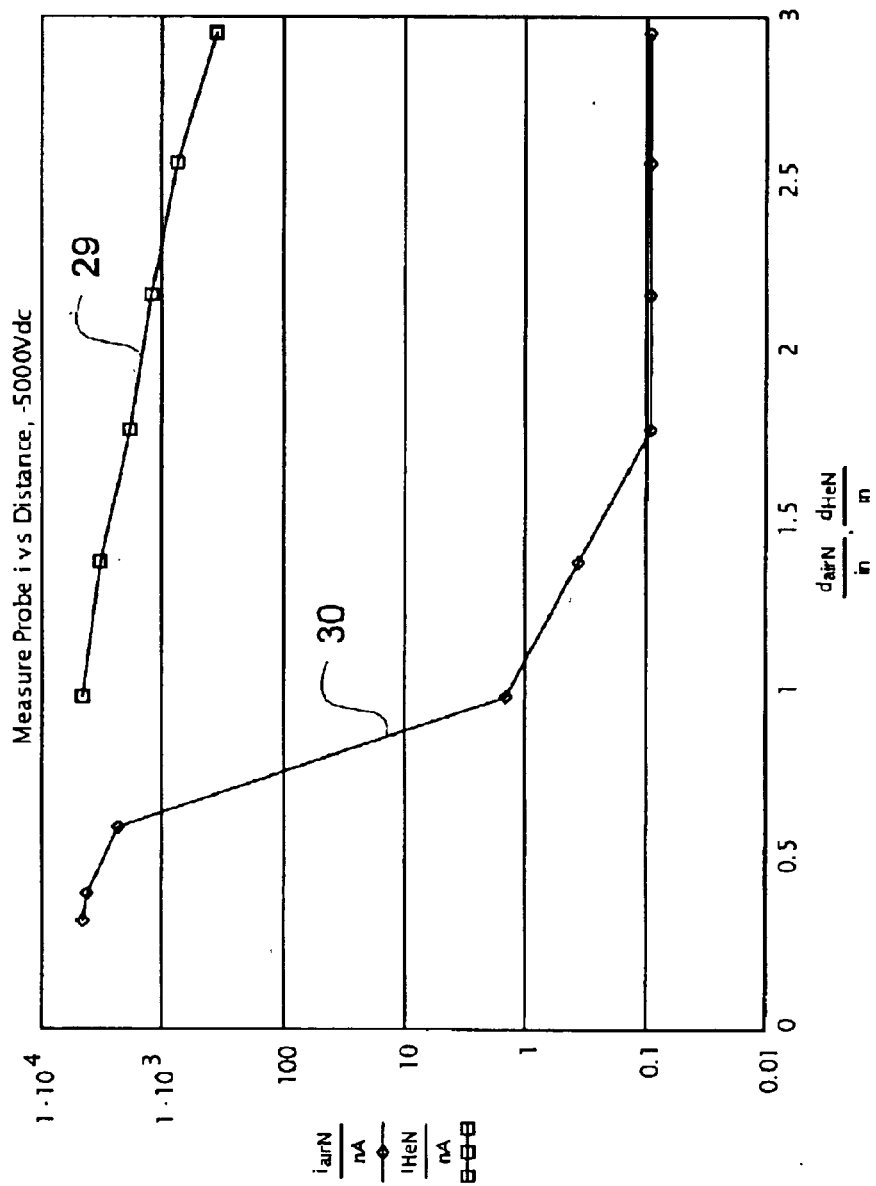
FIG. 3 is a graph of probe current vs. distance at −5000V.

In the first test, the results of which are shown in FIG. 2, the needle voltage was set to +5000 volts and the current was measured as the gap distance was reduced, both in air and pure He. Starting at 3 inches separation, the current was measured and the distance reduced until the current clipped at about 5 $\mu$A due to the limited voltage swing of the current-voltage converter used. The linear x-axis in FIG. 2 shows the separation distance in inches while the logarithmic y-axis displays the current in nanoamperes. The lower trace 28 is the current response in air while the upper trace 27 is the current response with ultrapure helium flowing across the gap at a very low, barely audible rate. As shown, the current in helium is about 30 times the current in Air. FIG. 3 shows the same test run with the needle voltage set to −5000 volts, again the lower trace 30 showing the response in air and the upper trace 29 showing the response in helium. The lower plateau on trace 30, at 0.1 nanoamps, represents the offset of the current-voltage converter and should be taken to be zero.

As can be seen from FIGS. 2 and 3, the response in helium is similar for either positive or negative polarity. In air, the response is markedly different, falling off to zero at a little over 1.5 inches in air while staying relatively high at that distance in helium. The overall response is slightly higher in helium with a negative probe polarity. Either polarity can be used in accordance with the present invention.

In the preferred embodiment of the present invention discussed below, a one watt 5000 volt dc-dc converter with a 1 Gohm current-limiting resistor in series serves as the power source. The resistor limits the maximum current that can be delivered to 5 microamps, a level safe for both human operators and electronic equipment.

Even though the DIF tool uses relatively high voltage, up to 5000 volts, touching the probe with say the operators finger, produces no sensation at all because 5 microamps is well below the threshold of perception for most people. In fact, it is several orders of magnitude less than typical currents encountered in everyday electrostatic events such as walking across a carpet. The only evidence that voltage is present is subtle and requires close examination. If viewed in a darkened room a dim corona discharge is just visible and a slight ionic wind can sometimes be heard.

In normal use the DIF tool does not produce spark discharges. It can, however, result in spark discharges similar to static events through the secondary mechanism of capacitance charging. When a person walks across a dry carpet, the capacitance of his body can become charged to levels as high a 35,000 volts. Subsequently touching a grounded surface discharges this charge instantly, in the form of a bright spark, with the initial instantaneous currents reaching as high as amperes. The DIF tool will charge capacitances in much the same manner. For example, if the DIF common is earth grounded and the operator is wearing highly insulating shoes, touching the probe will charge the operator to the full 5000 volt supply. Subsequently touching a grounded surface will dump this charge in much the same fashion, producing a "static" spark. Although certainly not dangerous, this can be easily avoided by not touching the probe.

Another relevant question concerns what damage the DIF tool might cause to equipment connected to the cable under test. The answer lies in the realization that the DIF source impedance is so high that it will not produce any significant voltage change on the wire unless the wire is floating, i.e., completely disconnected from everything. Any connected wire, whether power is switched on to the load or not, will exhibit an impedance to ground that is many orders of magnitude lower than the impedance of the gas and therefore all the voltage will be dropped across the gas and not the load. A basic principle of this invention is that that the DIF tool power supply is designed to produce only just enough current to span the distance across a very high impedance gas but not enough to produce much voltage across any real impedance. For example, if we assume a minimum real load power of say 1.4 watts (10 k$\Omega$ resistance), the maximum voltage induced onto this line will be equal to the maximum available DIF current (5 $\mu$A in the preferred embodiment) times 10 k$\Omega$ or 0.05 volts dc. Typical real loads, which are much lower in impedance, produce even lower voltages. For this reason, it is quite safe to operate the DIF tool on harnesses with loads connected. It should also be noted that it does not matter whether the load is turned on or off when the DIF tool is used. The presence of AC or DC voltages on the line that are low relative to the DIF probe voltage do not substantially affect the operation of the DIF tool.

When a floating wire is charged with the DIF tool, it can retain this charge for a period of time ranging from minutes to possibly several hours. If this wire is subsequently grounded, it will likewise produce a "static" spark as the charged interwire capacitance, typically on the order of hundreds of picofarads, is discharged. Since completely floating wires are not common and, by definition not connected to anything, this possibility does not appear to present a problem. The one item that could present a safety problem is a high-voltage, high insulation-resistance capacitor having a capacitance over a few nanofarads. Such a capacitor, though not known to exist in the aircraft environment, could be charged by the DIF tool and subsequently discharge enough energy to be dangerous in some circumstances.

The fine tip of the needle probe is used to advantage to create a voltage gradient large enough to initiate the avalanche process in the gas used. Since the breakdown voltage in air is on the order of 30 kV/cm, the needle probe must be sharp enough to produce this gradient from the available supply voltage. In some applications where it may be desirable to use the lowest possible probe voltage additional methods may be employed to initiate the breakdown. An obvious improvement is to make the probe tip sharper. Another method is to beat the probe tip to lower the Work Function of the metal. Tests by the present inventor have shown that heating the tip can both increase the current and lower the required voltage. Yet a third method involves the addition of an ionizing source near the needle tip using either ultraviolet radiation or a small radioactive source, perhaps similar to those used in smoke detectors.

The Preferred Embodiment

Figure 4:
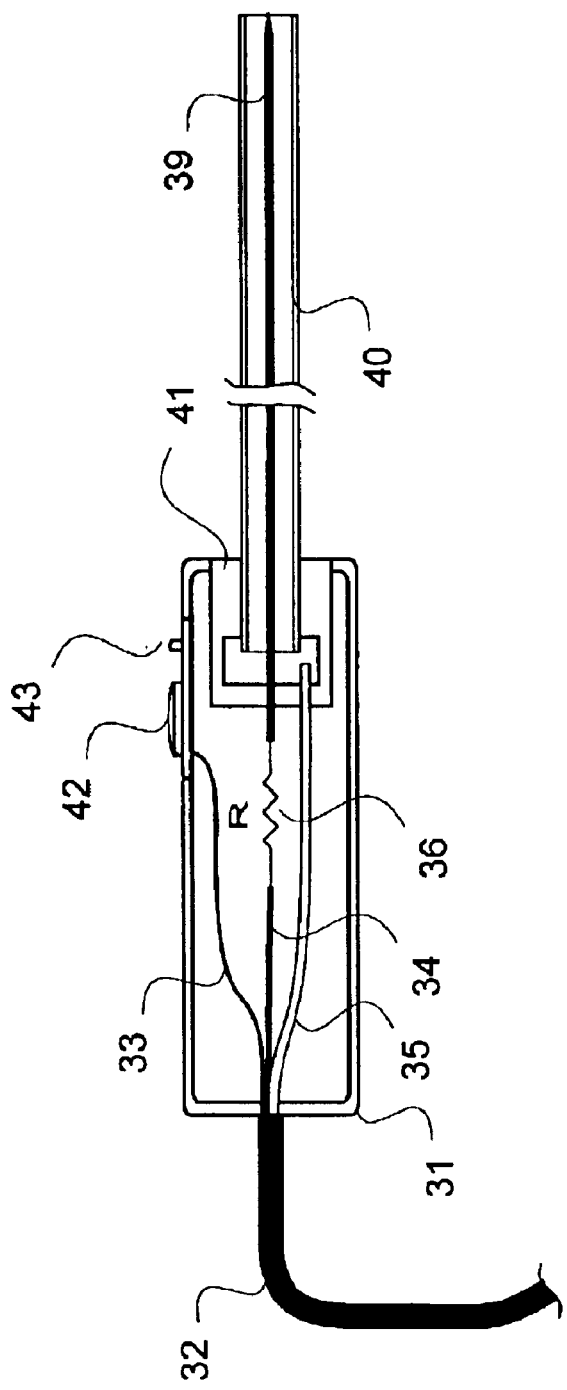
FIG. 4 is a simplified drawing of the DIF probe

The preferred embodiment of the DIF tool of the present invention consists of two connected assemblies, the DIF probe and the DIF control unit. FIG. 4 shows the handheld probe portion and FIG. 5 shows the connected control unit.

Referring first to FIG. 4, the handheld probe consists of a flashlight-size enclosure 31 made of an insulating material, such as ABS, in order to provide electrical isolation to the user. An umbilical cord 32 supplies control lines 33, the high-voltage wire 34, and the Helium tube 35 to the probe assembly. An integral high-voltage resistor 36, preferably on the order of 1 Gohm resistance, connects the incoming high-voltage wire 34 to the needle probe 39. The needle probe 39 is made from stainless steel with the tip is sharpened to a fine point. Prototypes of the present invention utilized needles manufactured for use in artist's airbrushes. Replacement needles are available from Airbrush manufacturers such as Badger Airbrush Company of Franklin Park, Ill. A tube 40 sheaths the needle probe 39 in order to provide a conduit for He gas to flow around the needle probe 39 and be directed out the end toward the harness being testing. The tube also serves to protect the delicate tip at the end of the needle probe 39 and can be fabricated out of any insulating material such as plastic, ceramic or glass, the latter being used in this preferred embodiment. The diameter of the tube 40 in FIG. 4 is drawn larger than need be for purposes of clarity—only a small space is needed between the tube 40 and the needle 39. A machined plastic block 41 serves to couple the incoming gas line 35 to the annular space around the needle probe 39. Both the sheath 40 and the needle probe 39 are sealed into this block 41 using a suitable O-ring sealing means. A thumb-actuated pushbutton switch 42 is provided on the enclosure to turn on and off the He gas flow and an LED 43 is provided to indicate when the gas is flowing.

Figure 5:
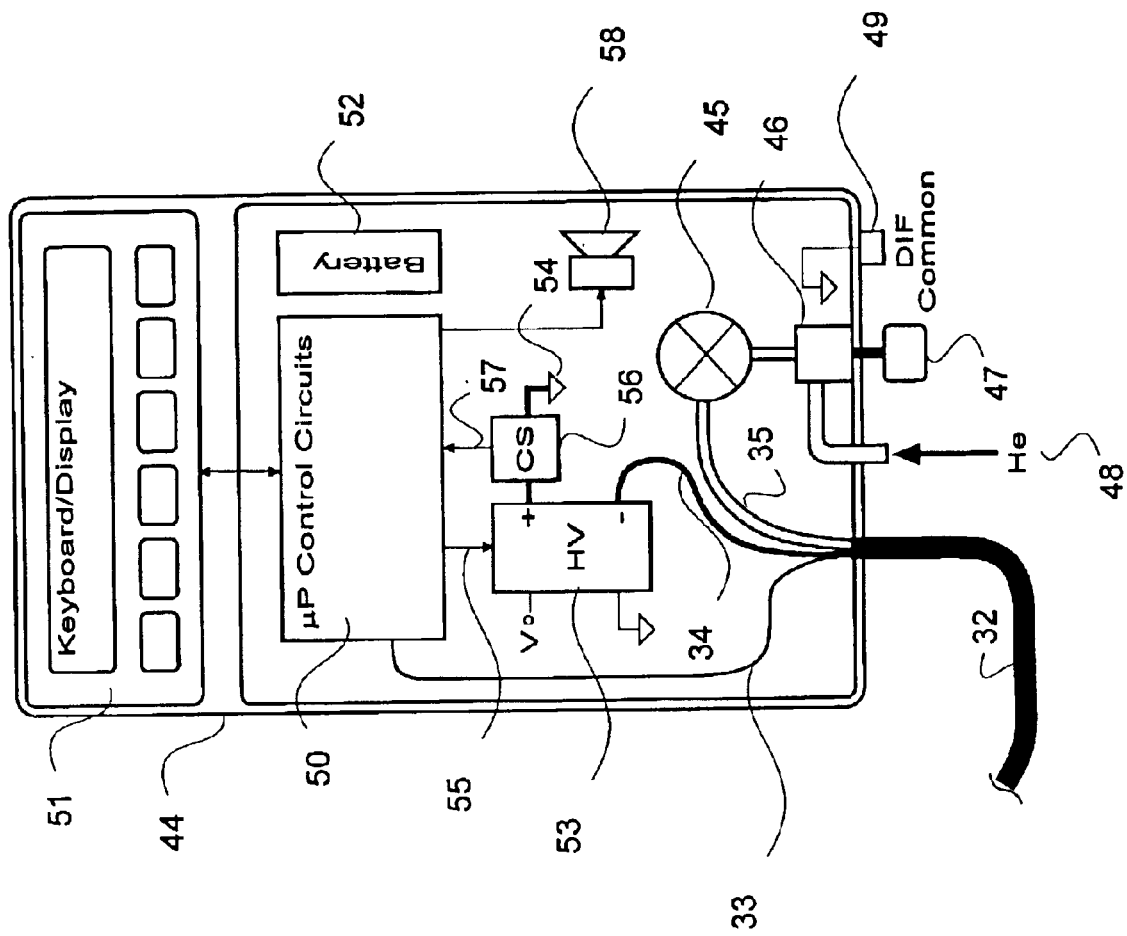
FIG. 5 is a simplified drawing of the DIF control unit.

The DIF control unit is shown in the simplified drawing of FIG. 5. A plastic insulated enclosure 44 encases the entire assembly to insulate the user from the internal circuits. The umbilical cord 32 supplies control lines 33, the high-voltage wire 34, and the Helium tube 35 to the probe assembly. A solenoid valve 45 serves to turn the Helium gas on and off under control of the microprocessor 50 and a manual needle valve 46 is used to adjust the flow rate by adjustment of the knob 47. To conserve gas, the flow rate should be adjusted just high enough to cover the area of the harness being investigated, on the order of 500 mL/min. The Helium source 48 is conveniently a gas bottle with an integral pressure regulator adjusted to about 20–40 PSI.

A keyboard/display module 51 serves to accept input from the user for programming of instrument parameters and to display measurement results. Control lines 33 connect the probe He switch and LED display to the microprocessor subsystem 50. An audible indicator 58 is provided to alert the user to the presence and proximity of a detected fault, the proximity indicated by changes in the audio frequency, character or repetition rate. The unit is powered by an internal battery 52 so as to make the entire circuit floating with respect to earth ground.

A programmable, isolated high-voltage inverter 53 switches the internal supply voltage V to a high DC voltage under control of the microprocessor 50 via control line 55. The voltage level is programmable by the user through the keyboard/display module 51 over a range of 1000 to 5000 volts. The polarity of the floating output of the inverter 53 can be either positive or negative depending on the needs of a particular application. In this embodiment, the needle probe polarity is negative and the positive side of the inverter output feeds through a current sensing circuit 56 to circuit common 54. The current sensor 56 measures the dc current flowing in the floating output stage of inverter 53, which is the same as the current flowing to the needle probe, and feeds this signal to an A-D converter in the microprocessor subsystem via line 57. The current sensing circuit 56 should be configured to measure dc current in the range of 0–5 microamps and include a filter means to reduce the high-frequency noise produced by the inverter 53. The DIF common terminal 49 connects directly to the circuit common 54 to provide a return path for the high-voltage current. A programmable high-voltage inverter suitable for use here is the C50N from EMCO High Voltage Corporation of Sutter Creek, Calif.

In operation, the user sets various parameters such as the high-voltage test level through the keyboard/display unit 51. While pointing the probe toward the cable harness, the user presses the button on the probe to begin the Helium gas flow and proceeds along the length of the harness searching for an indication of a fault. If a fault is indicated, through either the display or an audible indication, the user then moves the probe back and forth in such a manner as to maximize the signal strength.

What conductors the DIF tool responds to depends on where the DIF common terminal is connected. If the DIF common is connected to the airframe (ground) the tool will respond to insulation breaks in any connected wire in the aircraft, whether powered or unpowered. The particular advantage of this mode of operation is that it can be used on cable harnesses in situ without unplugging, turning off, or otherwise disturbing the harness. A disadvantage is that the tool also senses the airframe itself responding much like a metal detector as the probe approaches metal surfaces. The abrupt cutoff of conduction past a certain distance due to the avalanche conduction mechanism, the distance being dependent on the applied voltage, mitigates this problem. Tests on wire bundles several inches above a ground plane to simulate aircraft cable harnesses have demonstrated that insulation faults along typical cable runs can be effectively found. This mode of operation is clearly less effective where the harness goes through holes in struts, for example.

If the DIF common is instead connected to a single floating wire in a harness the tool will be responsive to insulation breaks on that wire alone, i.e., it will not respond to the airframe or any other wires. This mode of operation is made possible by the second improvement to the MED tool, discussed above, wherein the MED tool sequencer serves to connect the DIF common to a selected wire in the cable harness.

Referring again to the graphs of FIGS. 2 and 3, the relationships between current and distance are shown, the current in Helium being approximately linear with distance on a logarithmic scale. The microprocessor 50 (FIG. 5) uses these relationships to calculate the approximate distance to the fault, and either display it or otherwise indicate it in the form of changing audio feedback. The use of changing tones, for example, is desirable because it allows the user to focus his visual attention on the probe. As the user probes into a cable harness it may be helpful to provide a positive indication when the break has been reached. While the distance-to-the-fault indication can be used for this purpose it may be desirable to provide a more definitive indication.

As the DIF probe approaches to within a small fraction of an inch of the wire conductor, the conduction mechanism through the gas changes slightly, producing irregular discharges that look like tiny sparks. This may be due to the fact that as the probe approaches the conductor, the capacitance between the two increases, becoming large enough at close range to store some charge which is erratically discharged through this tiny sparks. Regardless of the actual mechanism, the advent of irregular impulses in the current can be used to advantage to sense when the probe as reached the conductor, i.e., when it has come to within a small fraction of an inch of the conductor. Accordingly, optional edge-detection circuitry means may be included in the current sensing circuit 56 to sense these irregular steps in the current and when present indicate to the user approximate contact with the fault.

A second DIF tool option provides the capability to detect the presence of AC line voltage on the sensed conductor as it is approached with the probe. An insulation break on a power line distribution conductor poses a greater potential arc danger than, for example, an insulation break on a signal conductor. For this reason, it is useful to indicate whether the conductor being sensed carries the line voltage or not. The DIF tool as discussed above measures the DC current flowing through the gas from the probe tip to the sensed conductor. If the sensed conductor carries line voltage, and if DIF common is connected to ground (the airframe) to complete the loop, then AC current will also flow backwards from the sensed conductor through the probe to ground. By including a means to detect the principle AC frequency component of the line voltage, the DIF tool can be made to sense the presence of line voltage on the sensed conductor.

The AC current that flows back through the probe equals the line voltage divided by the total reactance of the current path, which includes both resistive and capacitive components. The resistive component of the current is the current that flows through the series combination of the resistance of the gas and the current-limiting resistance 36 in FIG. 4. The capacitive component is the current that flows through the physical capacitor formed between the probe and the wire conductors. The resistive component flows only from the sensed wire and as such is responsive to the presence of line voltage on the sensed conductor. The capacitive component, however, flows from each adjacent line-powered wire in the harness regardless of whether it contains an insulation break or not. Consequently, in order to provide a signal responsive to line voltage on the sensed conductor alone, it is necessary to differentiate between the resistive and capacitive components of the AC current.

Figure 6:
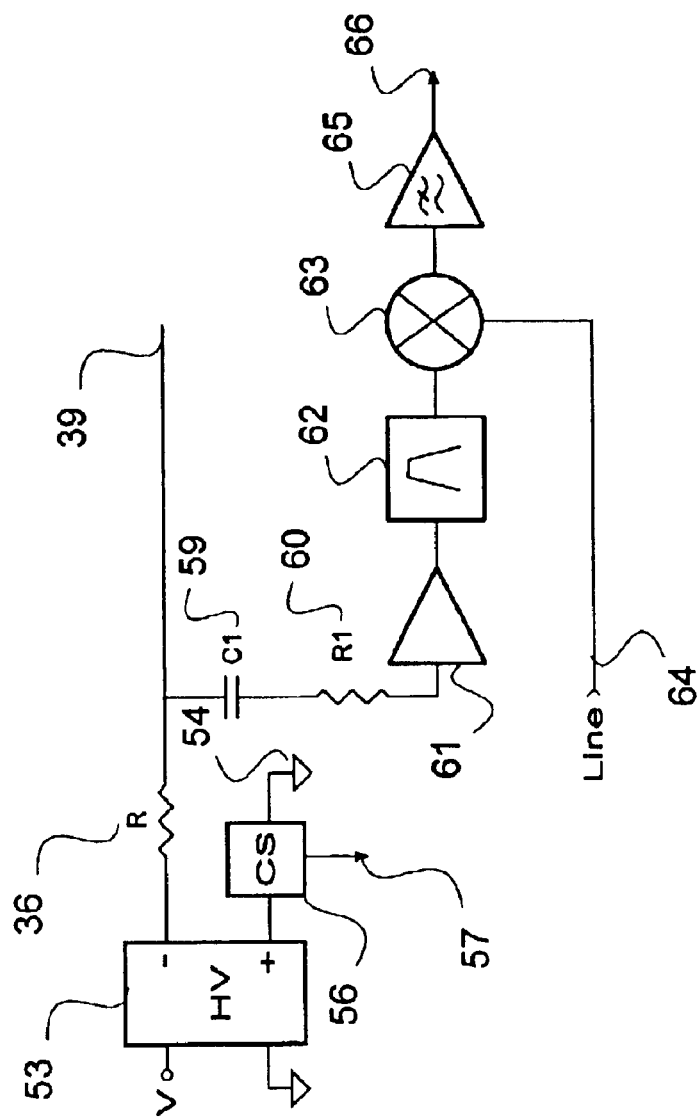
FIG. 6 is a simplified schematic of the optional AC line detection circuit.

Referring now to FIG. 6, a simplified schematic of the optional AC line current portion of the DIF tool is shown. As is FIG. 5, a floating switcher 53 provides a high voltage to the needle probe 39 through a current-limiting resistor 36. DC current is measured by sensing the current that flows through the secondary of the switching inverter 53 to ground 54 by means of a current sensor 56. An output 57 is provided that is responsive to the DC current flowing out the probe 39. One way to sense the AC line current would be to include an AC current sensor responsive to the line frequency in the current sensor 56 shown. This approach, however, limits the maximum AC current flow to the line voltage divided by the current limiting resistor 36, which is 1 Gohm in the preferred embodiment. The preferred approach, therefore, is to provide a separate path for the AC signal that has less series reactance and therefore draws more signal current from the line voltage enabling a higher signal-noise ratio. This AC path consists of a high-voltage coupling capacitor 59 in series with a lower-valued resistor 60 feeding a summing junction in amplifier 61. The values of this resistor and capacitor are adjusted to pass the line frequency with little attenuation or phase shift. In the preferred embodiment of this option, the resistor 60 is 50 Mohm and the capacitor 59 is 500 pf forming a single-pole high-pass filter with a corner frequency of just under 10 hz.

The output signal from amplifier 61 is fed through a band-pass filter 62 having a center frequency equal to the line frequency in order to make it responsive to the line frequency alone. The output of this filter 62 feeds a synchronous detector 63, which serves to separate the resistive and capacitive components of the AC current. The synchronous detector (or demodulator) 63 is well known in the art, being essentially a multiplier used to extract signals that are in phase with a reference frequency. In this case the reference frequency input 64 is the line frequency, obtained by sensing the line directly. A lowpass filter 65 smoothes the output to provide a signal 66 that is responsive to the resistive component of the AC current. This output is then fed to the microprocessor 50 (FIG. 5), which measures it and upon passing a preset threshold provides an audible indication to the user to indicate the presence of line voltage on the sensed conductor.

Gas Methods

Figure 7:
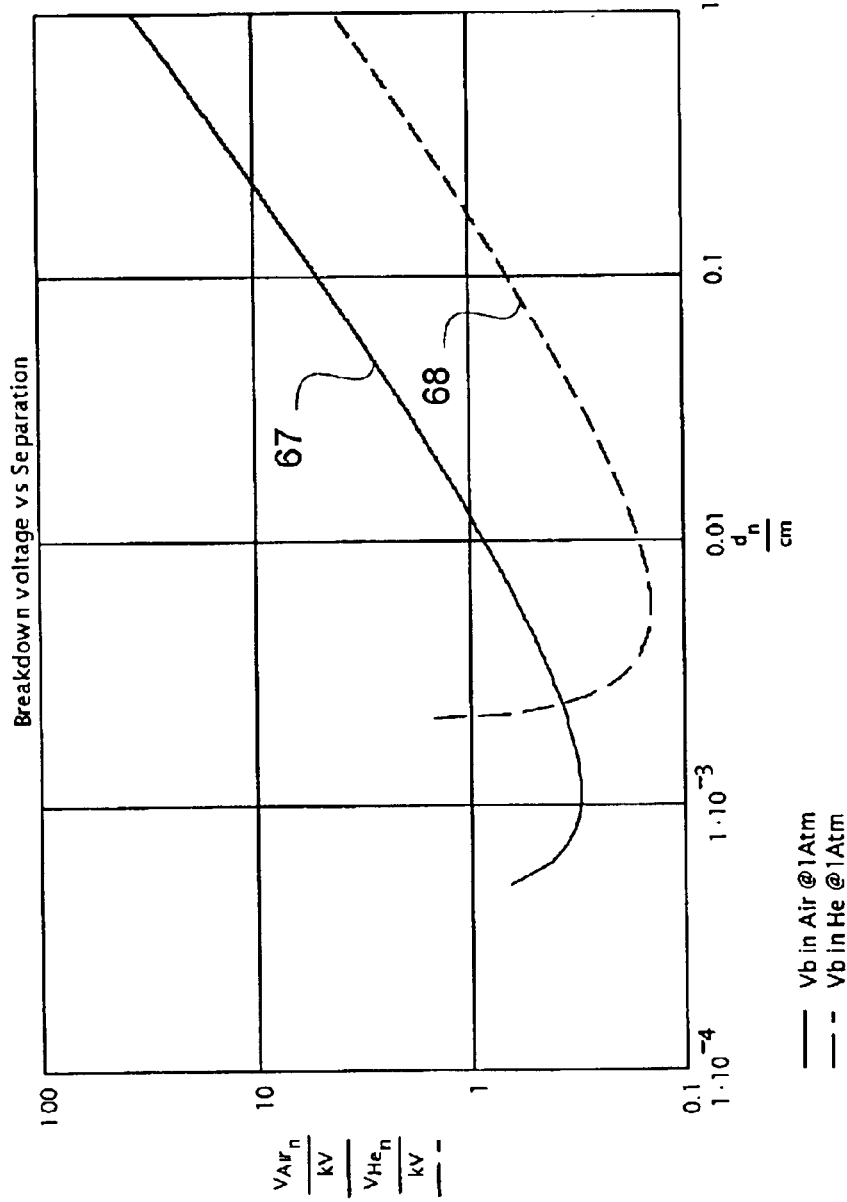
FIG. 7 is a graph of the breakdown voltage in Air and Helium.

Because unique characteristics of pure Helium gas are used to advantage in this invention an understanding of the mechanisms that cause Helium to differ from other gases is useful. To this end, the present inventor has made a theoretical analysis of the conduction mechanisms in pure gases including Helium and some of the results will be given here. Referring first to FIG. 7, a graph of the theoretical breakdown voltage for plane electrodes in both air and pure helium is shown. The x-axis shows electrode separation in centimeters and the y-axis shows breakdown voltage in kilovolts. The upper trace 67 is the theoretical breakdown voltage in air. The lower trace 68 is the theoretical breakdown voltage in pure helium gas. A prominent feature of both plots is that the breakdown voltage decreases to a minimum and then rises again as the electrode separation is decreased. This effect is real and in agreement with measured data. The upper curve shows a minimum breakdown voltage in Air of 305 volts at 11 micrometers separation. The lower curve shows a minimum breakdown voltage in He of about 142 volts at 51 micrometers. At separations less than about 3 micrometers, the breakdown voltage again begins to drop and becomes approximately linear with distance to zero volts.

Figure 8:
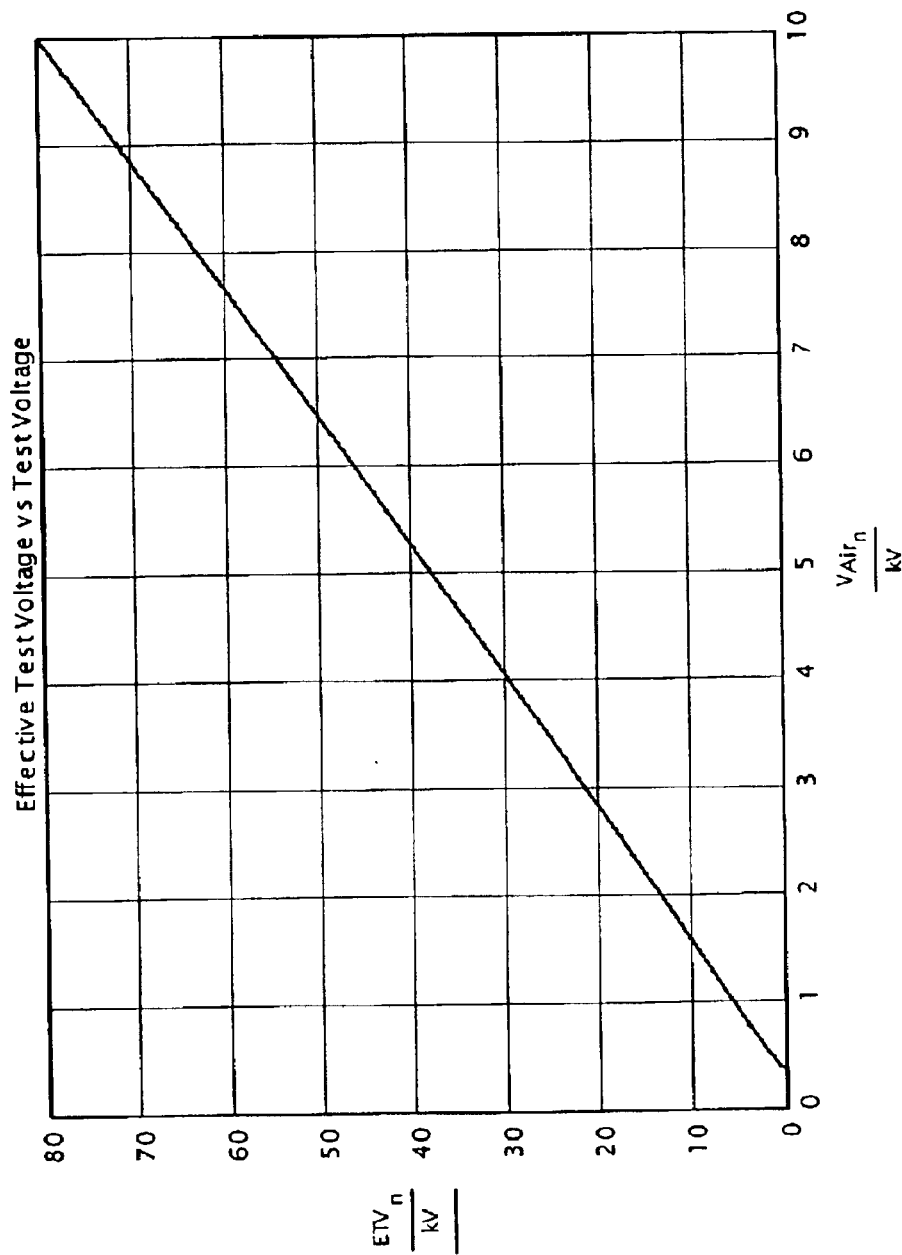
FIG. 8 is a graph of the Effective Breakdown Voltage vs. the Applied Test Voltage.

As illustrated in the graph of FIG. 7, plane electrodes with a separation of 1 millimeter require 5000 volts to flashover in Air but only 663 volts in pure helium. This means that if a test voltage of 663 volts were applied to a fault, the "Effective Test Voltage" in pure helium would be 5000 volts, 7.5 times higher. Looking at the same data another way, 663 volts applied in air would span a separation of only 0.067 mm while the same voltage applied in pure helium would span a 1 mm separation. FIG. 8 shows a derived plot of this Effective Test Voltage verses the Applied Test Voltage, the x-axis being the Applied Test Voltage in kilovolts and the y-axis being the Effective Test Voltage, also in kilovolts.

Accordingly, the first gas method of the present invention is to flow pure helium gas over portions of a cable harness under test with the MED tool in order to increase the Effective Test Voltage. The MED tool, in this case, would be programmed to maintain a preset high voltage on the WUT while the gas is applied to selected portions of the harness. Laboratory tests by the present inventor have shown that the real Effective Test Voltage depends on polarity, negative polarity giving a larger Effective Test Voltage, and is some-what lower than predicted by the theoretical Effective Test Voltage shown in FIG. 8.

Another method of the present invention is to apply helium gas to a cable harness or any electrical system, even while operating normally, i.e., fully connected and with normal operating voltages applied, in order to lower the breakdown voltage and thereby reveal developing parallel faults. This method includes exercising the system under test in order to generate normally occurring extraordinary voltages such as inductive kickback voltages that result from switching on and off loads. Furthermore, since faults in this case may develop high and possibly destructive currents, it may be advantageous to provide a means to limit the current to either the entire system under test or individual portions thereof.

Figure 9:
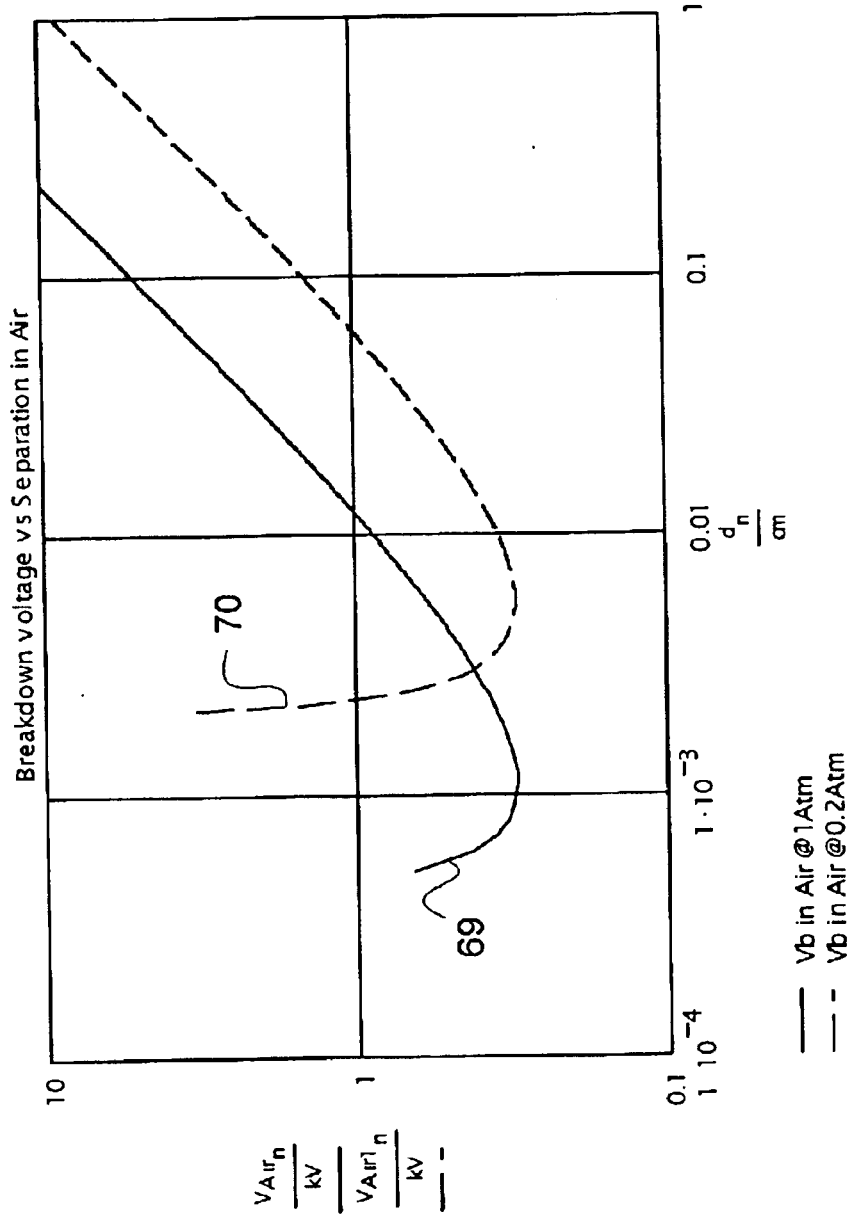
FIG. 9 is a graph of the breakdown voltage in Air at 1 atm. and 0.2 atm. ambient pressure.

The breakdown voltage in air can also be lowered by reducing the air pressure around the system being tested. FIG. 9 shows the breakdown voltage in air at 1 atmosphere 69 (the same as in FIG. 7) and in air at 0.2 atmosphere 70, the latter air pressure being approximately equivalent to 45,000 ft altitude above sea level. As shown in the data, the breakdown voltage at 0.1 mm separation is about 865 volts at sea level but only 161 volts at 45,000 ft. This clearly shows that just flying and aircraft at altitude could trigger a developing fault to arc.

Figure 10:
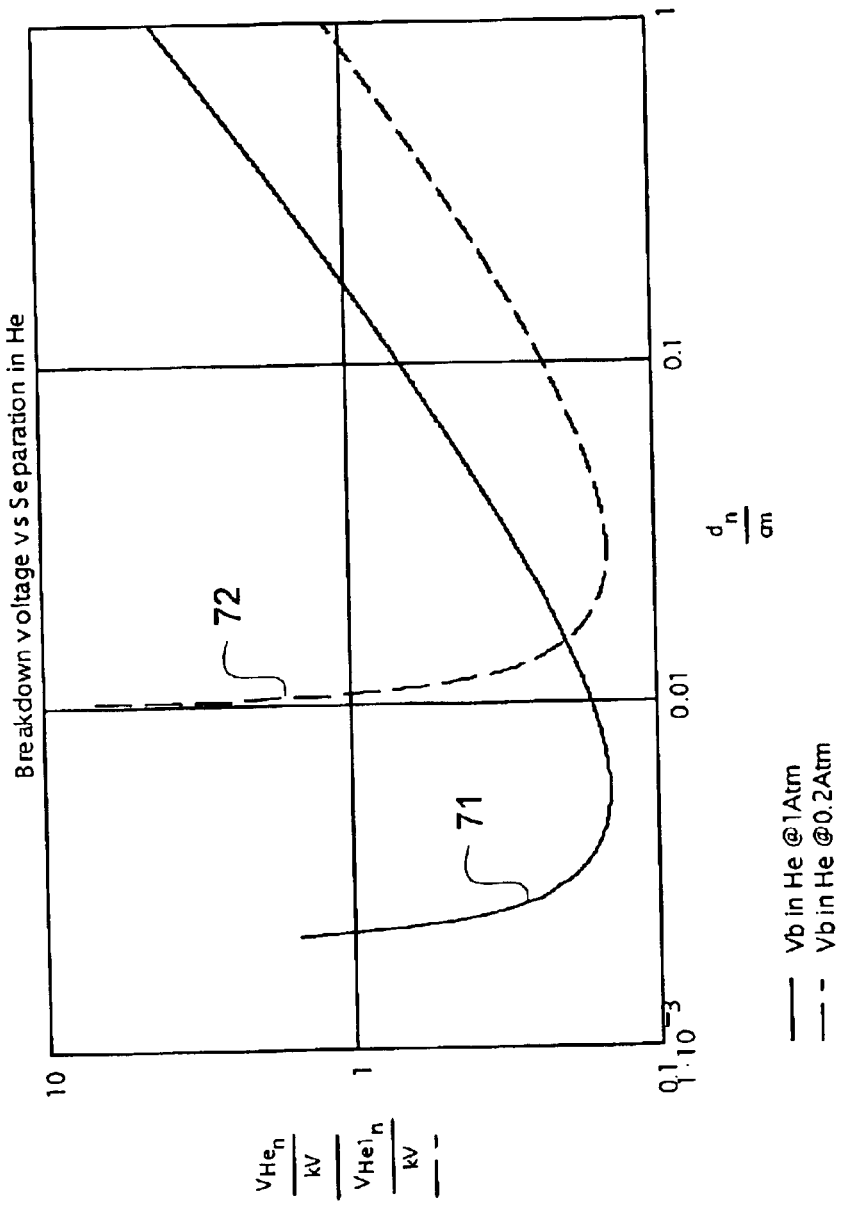
FIG. 10 is a graph of the breakdown voltage in Helium at 1 atm. and 0.2 atm. ambient pressure.

The breakdown voltage in Helium shows the same basic dependency on pressure as illustrated in the graph of FIG. 10. The breakdown voltage in helium at 1 atmosphere 71 (the same as in FIG. 7) and in air at 0.2 atmospheres 72 are shown. Accordingly, yet another method of the present invention is to reduce the ambient pressure around a cable harness or any electrical system, even while operating normally, i.e., fully connected and with normal operating voltages applied, in order to lower the breakdown voltage and thereby reveal developing parallel faults.

Helium gas must be highly purified to work effectively in these applications. To understand the reason for this, we must take a look at some fundamental physics. The table below shows the mobility of ions in various gases.

TABLE B

Mobility of singly charged gaseous ions at 0 C. and 760 Hg in [cm/sec]/[volt/cm]

| Gas | $K^-$ | $K^+$ |
| --- | --- | --- |
| Air (dry) | 2.1 | 1.36 |
| Air (very pure) | 2.5 | 1.8 |
| $N_2$ | 1.84 | 1.27 |
| $N_2$ (very pure) | 145 | 1.28 |
| $O_2$ | 1.8 | 1.3 |
| He | 6.3 | 5.09 |
| He (very pure) | 500 | 5.09 |
| $H_2$ | 8.15 | 5.9 |
| $H_2$ (very pure) | 7900 | |
| $CCL_4$ | 0.31 | 0.3 |

The mobility of anions in He, 6.3, is not much higher the mobility in dry air, 2.1.

But when the He is purified the mobility jumps to 500. The only gas with higher mobility is pure hydrogen, which has an exceptionally high mobility of 7900.

Since the current density, j, is directly proportional to the mobility $$j=neE(k^-+k^+)$$

where j=the current density n=the number of electrons/vol e=charge of an electron E=Electric field strength The mobility is a measure of how many electrons (given that they are available) will get through the gas per second under the influence of an electric field. Since the densities of all gases approach that of an ideal gas and are therefore nearly the same, the differences in mobility cannot be due to kinetic interactions. Rather the electrons must be 'lost' in transit. They are lost by forming negative ions when they collide with gas molecules, a process known as 'electron attachment', and different gas molecules have differing tendencies to form negative ions. Gases, whether atomic or molecular, that are lacking one or two electrons in their outer shell have this tendency and are known as electronegative gases. Examples include the Halogens (F, Cl, Br, I and At), which are missing one electron, and O, S, and Se, which are missing 2 electrons. A 'negative' gas containing Fluorine, Elgas $SF_6$, is widely used in high voltage work because it has a breakdown field strength of about 90 kV/cm, nearly three times that of air. The reason for this is that a gas can only be ionized if the rate of ionization exceeds the rate of electron attachment, and the rate of electron attachment to F is high. In He, on the other hand, there is no electron attachment because it has a complete first shell. Helium is classified as a Noble or Inert element and exists as a gas in its atomic form rather than as a diatomic molecule like most other common gases. If oxygen or other electronegative gases are present in the He, even in trace amounts, the mobility will be greatly reduced.

Accordingly, although all the references above have been to Helium gas in particular, it is to be considered in accordance with the present methods to use either highly purified Helium gas, or any other elemental or gas formulation that exhibits low electron attachment.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A system for detecting and locating parallel arc faults in a set of wires, at least, a parallel arc fault being defined as a condition in which wires in the set of wires are close enough to produce an arc, the arc being capable of producing an incident waveform and a reflected waveform, the two waveforms together forming a pulse that has a width, the system comprising:

a first device that includes:

a controller for receiving information and for processing the information to produce a number of control signals;

a current source having a first terminal coupled to a first node and a second terminal coupled to ground, the current source being controlled by the controller to produce a direct current so as to charge a capacitance up to the testing voltage, the capacitance being defined between a wire under test and the remaining wires of the set of wires;

a timing circuit interfaced to the controller, the timing circuit having a first terminal coupled to the first node and a second terminal coupled to ground, the timing circuit being receptive to the incident waveform and the reflected waveform at the first terminal so as to measure the width of the pulse, the width being approximately proportional to the distance from the device to the arc;

a sequencer for coupling the wire under test to the first node while grounding the remaining wires of the set of wires, the sequencer defining the wire under test as a previous wire under test when the device cannot detect the arc on the wire under test, the sequencer being adapted to choose another wire of the remaining wires of the set of wires and define the another wire as the wire under test while grounding the previous wire under test and the remaining wires; and a reflection minimizer interposed between the sequencer and at least one wire from the remaining set of wires, the reflection minimizer being capable of minimizing the attenuation of the amplitude of the pulse.

2. The system of claim 1, wherein the reflection minimizer is a resistor approximately equal in value to the characteristic impedance of the wire under test.

3. The system of claim 1, wherein the first device further comprises a user interface device coupled to the controller, the user interface including a display for displaying information from the controller and a keyboard for inputting information into the controller.

4. The system of claim 3, wherein the display of the first device is adapted to display the insulation resistance of the wire under test and the capacitance.

5. The system of claim 1, wherein the current source of the first device includes a voltage switching supply to produce DC voltage as determined by the controller, the DC voltage being in the range of less than about 6000 volts, the current source including a resistor coupled to the voltage switching supply, the resistor being in the range of about 1 gigaohm.

6. The system of claim 1, wherein the first device further comprises a voltage sensor for sensing a voltage level at the first node, the voltage sensor being comprised of a voltage divider.

7. The system of claim 1, wherein the first device further comprises a first relay that is actuated by the controller and is further adapted to couple the first node from ground.

8. The system of claim 1, wherein the timing circuit of the first device comprises:

means for measuring the width of the pulse, the width being proportional to the time for the incident waveform or the reflected waveform to travel from the parallel arcing fault back to the device; and means for calculating the distance to the parallel arcing fault by multiplying the propagation speed in the wire under test by one-half of the width of the pulse.

9. The system of claim 1, further including a second device having a common, the second device comprising:

a probe having a tip that is capable of discharging current to the wire on which the arc originates;

a high-voltage supply having one polarity coupled to the tip of the probe and another polarity coupled to the common;

a distance estimator for calculating the distance from the probe to the arc by analyzing the amount of discharged current, which is approximately proportional to the distance from the probe to the conductor; and a gas supplier having a nozzle for supplying a gas, which has low electron attachment, within proximity to the tip of the probe.

10. The system of claim 9, wherein the common is coupled to the airframe.

11. The system of claim 9, wherein the common is coupled to the wire under test.

12. The system of claim 11, wherein the first device further comprises a second relay that is actuated by the controller and is further adapted to couple the first node at least to one of the current source and the common.

13. The system of claim 9, wherein the second device further comprises a first sensing circuit that senses when the probe is within a small fraction of an inch of the arc so as to indicate to the user that the are has been located.

14. The system of claim 9, wherein the second device further comprises a second sensing circuit that senses whether the wire under test is powered by an AC line voltage.

15. A method for detecting parallel arc faults in a set of wires, the method comprising:

selecting a first wire of the set of wires and defining the first wire as a wire under test while grounding the remaining wires in the set of wires to define these remaining wires as ground wires;

charging a capacitance defined between the wire under test and the ground wires using a current source to ramp up the voltage on the wire under test to a maximum test voltage lever;

determining that an arc has occurred when the voltage on the wire under test drops precipitously; and calculating the approximate distance to an arc when the arc has occurred on the wire under test by determining the difference in arrival times among incident and reflected waveforms from the arc.

16. The method of claim 15, further comprising pointing a probe toward the set of wires to locate the arc, the probe having a tip being capable of conducting current to the wire under test.

17. The method of claim 16, wherein determining that an arc has occurred includes coupling one polarity of a high-voltage source to a tip of a probe and another polarity of the high-voltage source to a common, the common being coupled to the wire under test.

18. The method of claim 17, further comprising flowing a low electron-attachment gas within the vicinity of the tip of the probe so as to increase the conduction of current to a location on the wire under test where the arc originates.

19. The method of claim 16, further comprising sensing by a first sense circuit when the probe is within a fraction of an inch of the arc so as to indicate to the user that the are has been located.

* * * * *